US012720715B2

(12) United States Patent
Ting et al.

(10) Patent No.: US 12,720,715 B2
(45) Date of Patent: Aug. 25, 2026

(54) LIQUID COOLING DEVICE AND SERVER

(71) Applicant: Fulian Precision Electronics (Tianjin) Co., LTD., Tianjin (CN)

(72) Inventors: Yu-Chia Ting, Neihu (TW); Chia-Nan Pai, Tu-Cheng (TW); Tsung-Lin Liu, Neihu (TW); Yen-Lu Cheng, New Taipei (TW); Chuang-Wei Tseng, New Taipei (TW); Hao-Wen Cheng, Neihu (TW)

(73) Assignee: Fulian Precision Electronics (Tianjin) Co., LTD., Tianjin (CN)

( * ) Notice: Subject to any disclaimer, the term of this patent is extended or adjusted under 35 U.S.C. 154(b) by 252 days.

(21) Appl. No.: 18/665,443

(22) Filed: May 15, 2024

(65) Prior Publication Data

US 2024/0397673 A1 Nov. 28, 2024

(30) Foreign Application Priority Data

May 22, 2023 (CN) ........................ 202310581806.3

(51) Int. Cl.
*H05K 7/20* (2006.01)

(52) U.S. Cl.
CPC ..... *H05K 7/20772* (2013.01); *H05K 7/20327* (2013.01)

(58) Field of Classification Search
CPC ........... H05K 7/20772; H05K 7/20809; H05K 7/20327; H05K 7/20272
See application file for complete search history.

(56) References Cited

U.S. PATENT DOCUMENTS

| | | | | |
|---|---|---|---|---|
| 2016/0270267 | A1* | 9/2016 | Chainer | H05K 7/20781 |
| 2016/0273996 | A1* | 9/2016 | Alshinnawi | G01M 3/32 |
| 2020/0340767 | A1* | 10/2020 | Holden | H05K 7/20254 |
| 2021/0185860 | A1* | 6/2021 | Hashimoto | H05K 7/20654 |
| 2023/0067321 | A1* | 3/2023 | Gao | H05K 7/20272 |
| 2023/0171921 | A1* | 6/2023 | Field | H05K 7/20772 700/300 |
| 2024/0369315 | A1* | 11/2024 | Yang | H05K 7/20272 |

FOREIGN PATENT DOCUMENTS

| | | | |
|---|---|---|---|
| CN | 106527637 | A | 3/2017 |
| TW | I683612 | B | 1/2020 |

* cited by examiner

*Primary Examiner* — Jacob R Crum
(74) *Attorney, Agent, or Firm* — ScienBiziP, P.C.

(57) ABSTRACT

A liquid cooling device comprises a cabinet, a liquid flowing unit, a liquid tray, and a liquid sensor. The cabinet is configured for containing an electronic component. The liquid flowing unit comprises a plurality of liquid delivery pieces connected and configured for circulating coolant to cool the electronic component. The liquid tray defines a confluence groove configured for gathering the coolant leaking from two connected ones of the plurality of liquid delivery pieces. The liquid sensor is placed in the confluence groove and is configured for sending a signal when contacting with the coolant. When the coolant leaks from two connected ones of the plurality of liquid delivery pieces then drops on the liquid tray and flows into the confluence groove by gravity, the liquid sensor contacts with the coolant in the confluence groove and sends the signal. A server with the liquid cooling device is also disclosed.

16 Claims, 6 Drawing Sheets

LIQUID COOLING DEVICE AND SERVER

FIELD

The disclosure herein generally relates to information computing systems, and more particularly relates to a liquid cooling device and server.

BACKGROUND

Due to the development of high-power consumption application (cloud computing, edge computing, or high-performance computing), power density per server increases year by year. Liquid cooling is a necessary cooling technology for server. Usually, CDU (Coolant Distribution Unit) or RPU (Reservoir and Pump Unit) is needed as pumping, cooling, and control equipment for liquid cooling solution. However, the leakage of CDU or RPU is one of the biggest potential risks in the cooling system, because it might damage the electronic components.

BRIEF DESCRIPTION OF THE DRAWINGS

Many aspects of the disclosure can be better understood with reference to the following drawings. The components in the drawings are not necessarily drawn to scale, the emphasis instead being placed upon clearly illustrating the principles of the disclosure. Moreover, in the drawings, like reference numerals designate corresponding parts throughout the several views.

DETAILED DESCRIPTION

Figure 1:
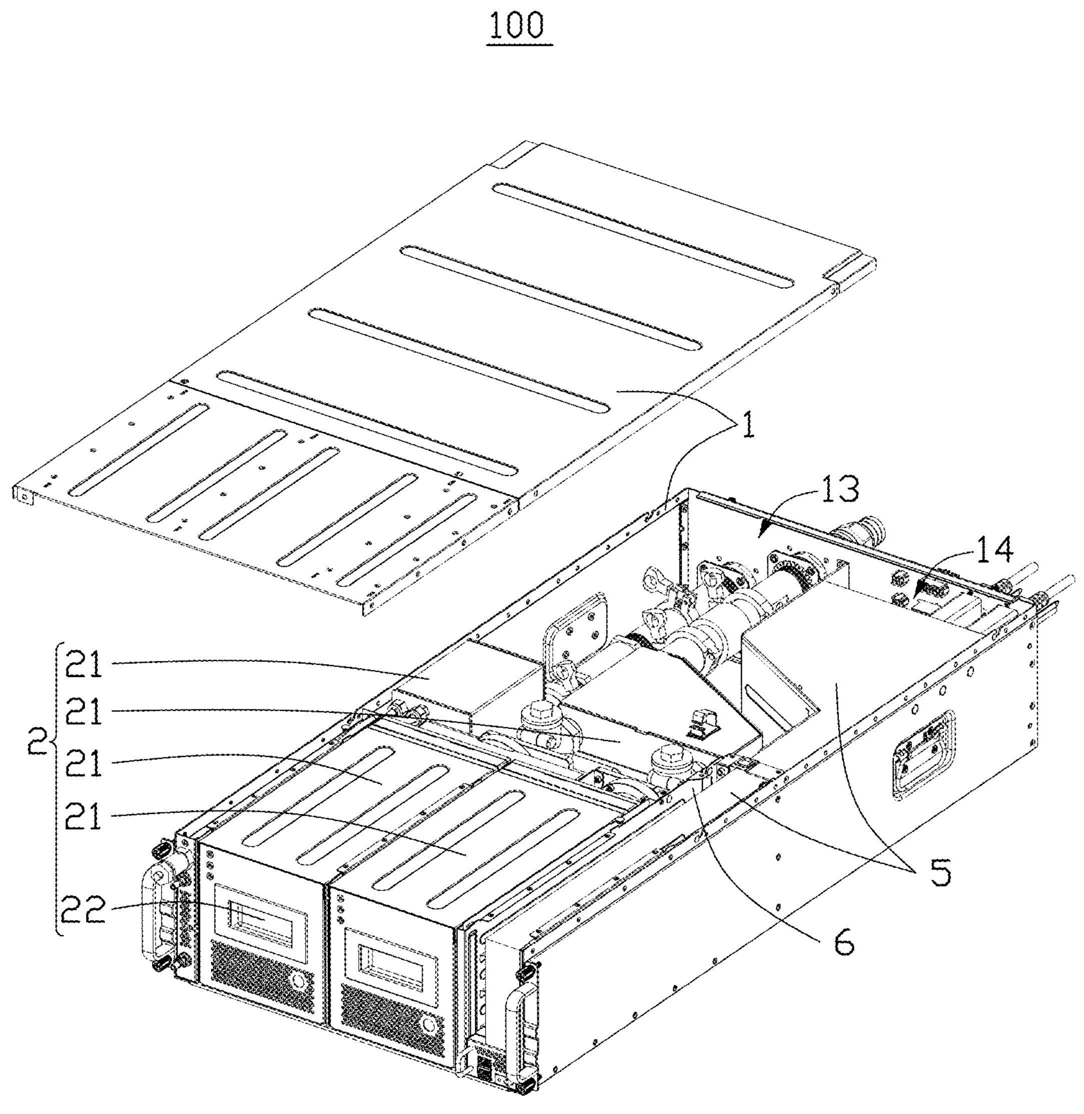
FIG. 1 is an exploded view of a cabinet according to an embodiment of the present disclosure.

It will be appreciated that for simplicity and clarity of illustration, where appropriate, reference numerals have been repeated among the different figures to indicate corresponding or analogous elements. In addition, numerous specific details are set forth in order to provide a thorough understanding of the embodiments described herein. However, it will be understood by those of ordinary skill in the art that the embodiments described herein can be practiced without these specific details. In other instances, baffle structures, procedures, and components have not been described in detail so as not to obscure the related relevant feature being described. Also, the description is not to be considered as limiting the scope of the embodiments described herein. The drawings are not necessarily to scale and the proportions of certain parts have been exaggerated to better illustrate details and features of the present disclosure.

The present disclosure, including the accompanying drawings, is illustrated by way of examples and not by way of limitation. Several definitions that apply throughout this disclosure will now be presented. It should be noted that references to “an” or “one” embodiment in this disclosure are not necessarily to the same embodiment, and such references mean “at least one”.

The term “comprising” means “including, but not necessarily limited to;” it specifically indicates open-ended inclusion or membership in a so-described combination, group, series, and the like.

Without a given definition otherwise, all terms used have the same meaning as commonly understood by those skilled in the art. The terms used herein in the description of the present disclosure are for the purpose of describing specific embodiments only, and are not intended to limit the present disclosure.

Figure 2:
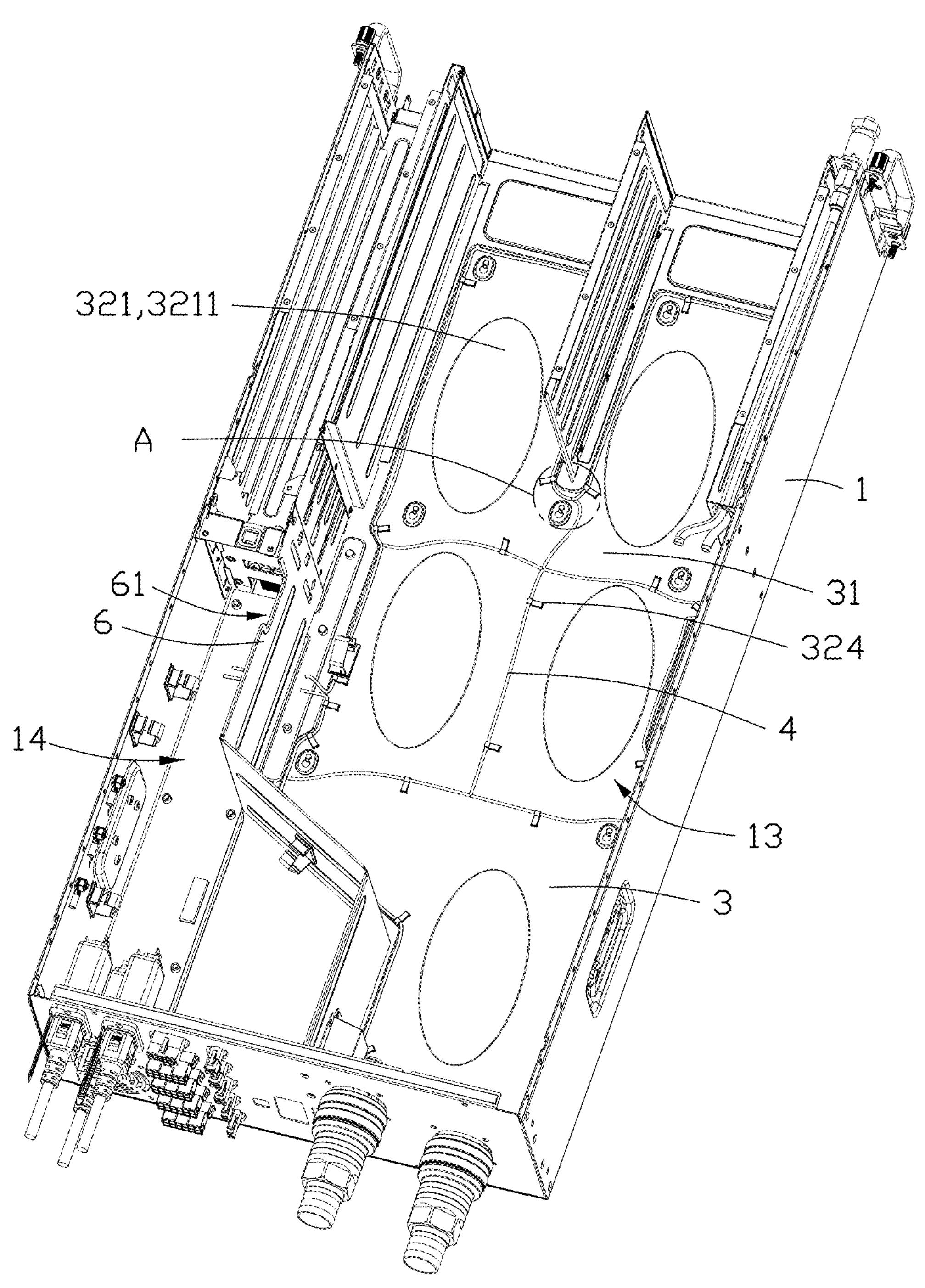
FIG. 2 is an isometric view of the cabinet showing a liquid tray in FIG. 1.

As shown in FIG. 1 and FIG. 2, a liquid cooling device 100 in an embodiment includes a cabinet 1, a liquid flowing unit 2, a liquid tray 3, and a liquid sensor 4. The cabinet 1 is configured for containing an electronic component 22, such as hard drives or expansion cards. The liquid flowing unit 2 is placed in the cabinet 1. The liquid flowing unit 2 includes a plurality of liquid delivery pieces 21. The plurality of liquid delivery pieces 21 are connected in sequence for circulating coolant to cool the electronic component 22. The liquid tray 3 is placed in the cabinet 1 and is placed below the liquid flowing unit 2. The liquid tray 3 defines a confluence groove 31, and the confluence groove 31 is used for gathering the coolant leaking from a joint gap between two connected ones of the plurality of liquid delivery pieces 21. The liquid sensor 4 is placed in the confluence groove 31. The liquid sensor 4 can send a signal when the liquid sensor 4 senses the coolant, and the liquid sensor 4 senses the coolant by contacting the coolant. When the coolant leaks from two connected ones of the plurality of liquid delivery pieces 21 then drops on the liquid tray 3 and flows into the confluence groove 31 by gravity, the liquid sensor 4 contacts with the coolant in the confluence groove 31 and sends the signal, and the signal is used for warning of coolant leakage.

In some embodiments, the liquid tray 3 is detachably or non-detachably mounted on the cabinet 1.

As shown in FIG. 1 and FIG. 2, in some embodiments, the joint gaps between each two connected ones of the plurality of liquid delivery pieces 21 are above the liquid tray 3, to ensure that the coolant leaking from the joint gaps can be collected by the liquid tray 3 and flow into the confluence groove 31 eventually.

Figure 3:
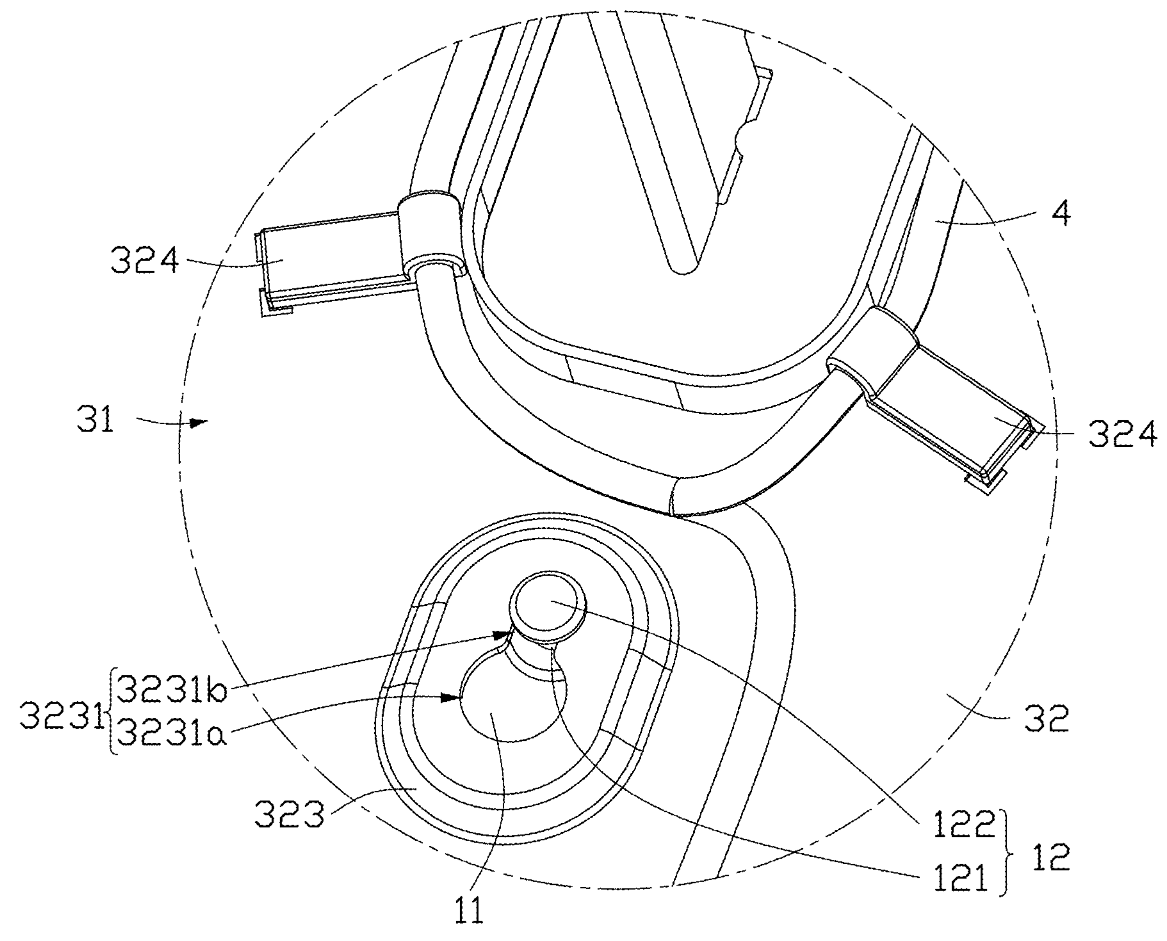
FIG. 3 is an enlarged view of the A area in FIG. 2.

As shown in FIG. 2 and FIG. 3, in some embodiments, the liquid sensor 4 is a wire, such as a leakage wire. The coolant includes, but is not limited to, water. When the liquid sensor 4 contacts with the coolant, the current and voltage of the liquid sensor 4 will change, thereby confirming coolant leakage.

Figure 5:
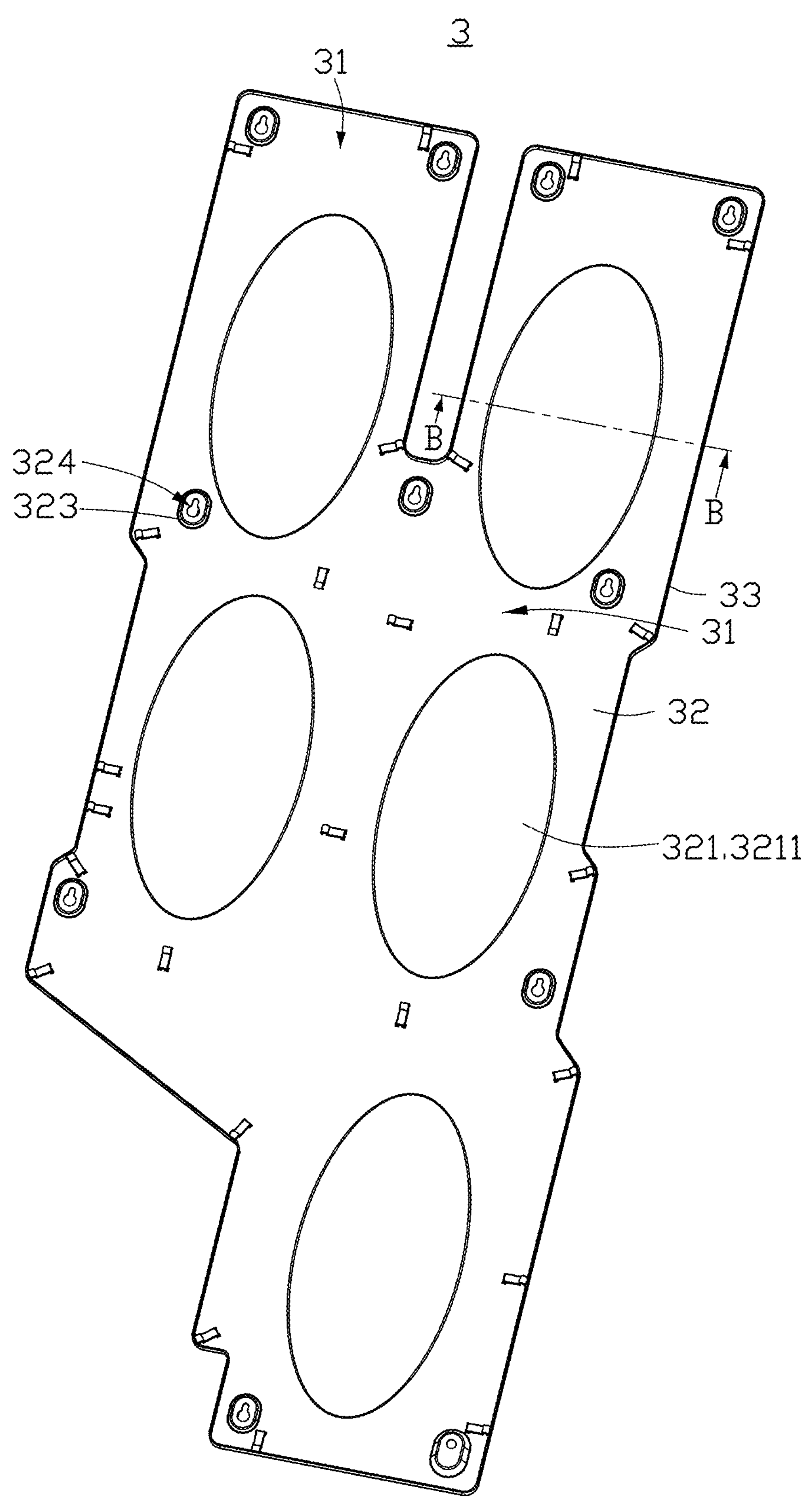
FIG. 5 is an isometric view of the liquid tray showing a liquid sensor removed in FIG. 4.

As shown in FIG. 2 and FIG. 5, in some embodiments, the liquid tray 3 includes a base plate 32 and an edge board 33. The edge board 33 is connected to an edge of the base plate 32 and is located on an upper surface of the base plate 32. The upper surface of the base plate 32 faces the liquid flowing unit 2 and the electronic component 22. The confluence groove 31 is formed along the edge board 33 on the upper surface of the base plate 32. The liquid sensor 4 is located on the upper surface of the base plate 32.

As shown in FIG. 2 and FIG. 5, in some embodiments, the base plate 32 and the edge board 33 are integrally formed through the sheet metal process. The edge board 33 is bent relative to the base plate 32, and the liquid sensor 4 is located along the bend between the base plate 32 and the edge board 33.

Figure 6:
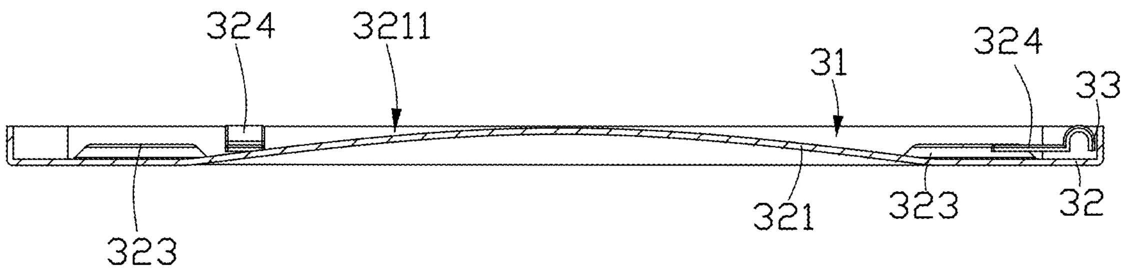
FIG. 6 is a section view of the liquid tray in B-B in FIG. 5.

As shown in FIG. 2, FIG. 5, and FIG. 6, in some embodiments, the base plate 32 includes a plurality of bumps 321. The plurality of bumps 321 protrude from the upper surface of the base plate 32 to the liquid flowing unit 2. The liquid sensor 4 is located on an area of the upper surface of the base plate 32 without the plurality of bumps 321. The confluence groove 31 is formed around the foot of each of the plurality of bumps 321. The plurality of bumps 321 can guide the coolant to flow down to the confluence groove 31 by gravity when the coolant drops on the plurality of bumps 321.

When the coolant drops on one of the plurality of bumps 321, the coolant flows down along the surface of the one of the plurality of bumps 321 by gravity until the coolant flows down to the foot of the one of the plurality of bumps 321, so that the coolant flows into the confluence groove 31 and the liquid sensor 4 contacts the coolant. Therefore, there is no need to cover the upper surface of the base plate 32 with the liquid sensor 4 as a wire, reducing the length of liquid sensor 4 as a wire and saving costs.

In some embodiments, the plurality of bumps 321 can be cancelled, and the upper surface of the base plate 32 is a bevel (not shown in FIGs). The liquid sensor 4 and the confluence groove 31 is located at the foot of the bevel.

Figure 4:
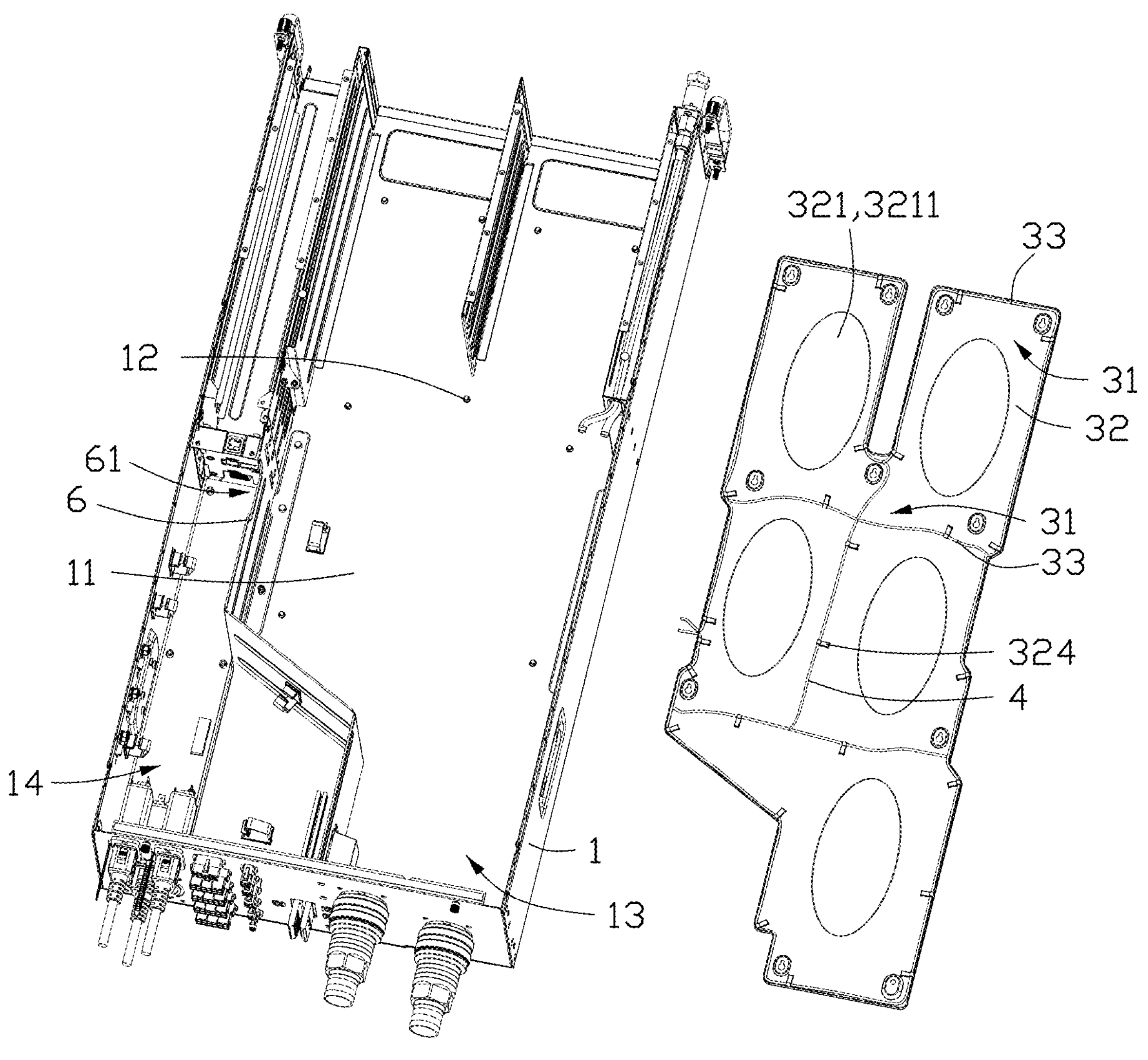
FIG. 4 is an exploded view of the cabinet and the liquid tray in FIG. 2.

As shown in FIG. 2 and FIG. 4, in some embodiments, generally, the space in the cabinet 1 is not big enough, so the space in the cabinet 1 used to set the liquid tray 3 is very small, usually, the liquid tray 3 is placed in the gap between the liquid flowing unit 2 and the inner bottom of the cabinet 1. Therefore, the height of the liquid tray 3 is small, and the height of the liquid tray 3 is equal to the height of the edge board 33, the height of each of the plurality of bumps 321, and the depth of the confluence groove 31. The surface of the liquid tray 3 covers the surface of the liquid flowing unit 2 and the electronic component 22, so the liquid tray 3 can collect all joint gaps above where is possible to leak the coolant.

As shown in FIG. 2, FIG. 5, and FIG. 6, in some embodiments, each of the plurality of bumps 321 has an ellipsoidal surface 3211. The ellipsoidal surface 3211 protrudes from the upper surface of the base plate 32 to the liquid flowing unit 2. When the coolant drops on one of the plurality of bumps 321, the ellipsoidal surface 3211 can prevent the coolant from staying on the one of the plurality of bumps 321, thereby allowing the coolant to flow down to the confluence groove 31, so that the liquid sensor 4 detects the coolant leakage in time.

In some embodiments, the ellipsoidal surface 3211 can be replaced as a spherical surface according to the shape of the plurality of bumps 321. Each of the plurality of bumps 321 has only one highest point along the direction of gravity.

In some embodiments, there can be only one bump 321 on the base plate 32, the liquid sensor 4 is placed between the foot of the bump 321 and the edge board 33. However, the height of the liquid tray 3 is small, so the inclination of the only one bump 321 must be small, and it is hard for the coolant to flow down by gravity. At the same height, the larger the area of the bump 321 is, the greater the inclination of the bump 321 is. That is why the plurality of bumps 321 are better, because the area of each bump 321 can be decreased, and the inclination of each bump 321 can be increased, which is easier for the coolant to flow down by gravity, improving the efficiency of detecting the coolant leakage.

As shown in FIG. 2 and FIG. 4, in some embodiments, the cabinet 1 includes an inner bottom surface 11 and a positioning piece 12. The liquid tray 3 is placed between the liquid flowing unit 2 and the inner bottom surface 11. The positioning piece 12 includes a cylinder 121 and a block 122. The cylinder 121 is connected to the inner bottom surface 11. The block 122 is located on an end of the cylinder 121 away from the inner bottom surface 11. The area of the block 122 is greater than the area of the cylinder 121. The distance between the block 122 and the inner bottom surface 11 is equal to the thickness of the base plate 32. The base plate 32 has a connecting part 323. The connecting part 323 protrudes from the base plate 32 to the liquid flowing unit 2. The connecting part 323 has a strip hole 3231. The strip hole 3231 passes through the base plate 32. The strip hole 3231 has a first section 3231*a* and a second section 3231*b* connected to each other. The first section 3231*a* allows the block 122 and the cylinder 121 to pass through the base plate 32. The second section 3231*b* allows the cylinder 121 to pass through the base plate 32 but does not allow the block 122 to pass through the base plate 32.

When installing the liquid tray 3 to the cabinet 1, passing the block 122 through the first section 3231*a*, and then moving the base plate 32 horizontally until the cylinder 121 moves into the second section 3231*b* from the first section 3231*a*, because the block 122 cannot pass through the second section 3231*b*, the block 122 and the inner bottom surface 11 hold the base plate 32 tight, to position the base plate 32 to the cabinet 1. And because the connecting part 323 protrudes from the base plate 32, the coolant cannot flow into the strip hole 3231.

As shown in FIG. 2 and FIG. 4, in some embodiments, there are a plurality of connecting parts 323 and a plurality of positioning pieces 12, the positioning piece 12 corresponds to the connecting part 323 one-to-one to better position the base plate 32 to the cabinet 1.

As shown in FIG. 2, FIG. 4, and FIG. 5, in some embodiments, the base plate 32 has a plurality of hooks 324. The plurality of hooks 324 are located on the upper surface of the base plate 32 and are arranged along the liquid sensor 4 as a wire, to position the liquid sensor 4 to the base plate 32. Furthermore, the plurality of hooks 324 press the liquid sensor 4 to the base plate 32, to ensure that the liquid sensor 4 contacts the upper surface of the base plate 32, so there is no gap between the liquid sensor 4 and the upper surface of the base plate 32, improving the efficiency of detecting the coolant for the liquid sensor 4 when the coolant flows to the confluence groove 31.

As shown in FIG. 1, FIG. 2, and FIG. 4, in some embodiments, the cabinet 1 has a liquid cooling area 13 and an electrical control area 14. The liquid cooling area 13 and the electrical control area 14 are arranged in a horizontal direction. The liquid flowing unit 2 is placed in the liquid cooling area 13. The liquid tray 3 is placed in the liquid cooling area 13. The liquid cooling device 100 further includes an electronic control unit 5. The electronic control unit 5 is placed in the electrical control area 14. The liquid flowing unit 2 and the liquid sensor 4 are electrically connected to the electronic control unit 5.

The electronic control unit 5 is used for controlling the flowing of the coolant in the liquid flowing unit 2. The electronic control unit 5 can receive the signal sent by the liquid sensor 4. Due to the area division of the liquid cooling area 13 and the electrical control area 14, the electronic control unit 5 involved in electricity is separated from the liquid flowing unit 2 involved in water, which reduces the risk of coolant leakage in the electronic control unit 5 even if the coolant leakage occurs in the electrical control area 14.

As shown in FIG. 1, FIG. 2, and FIG. 4, in some embodiments, the liquid cooling device 100 further includes a partition 6. The partition 6 is placed in the cabinet 1, the partition 6 separates the cabinet 1 into the liquid cooling area 13 and the electrical control area 14. The partition 6 seals the connection between the liquid cooling area 13 and the electrical control area 14. Furthermore, the partition 6 and the cabinet 1 are bonded with sealant to prevent coolant from flowing from the liquid cooling area 13 to the electrical control area 14.

As shown in FIG. 1 and FIG. 2, in some embodiments, the partition 6 has an opening 61. The opening 61 is located on the top of the partition 6. The opening 61 is connected to the liquid cooling area 13 and the electrical control area 14. The liquid cooling device 100 further includes a cable (not shown in FIGs). The liquid flowing unit 2 is connected to the electronic control unit 5 through the cable. The liquid sensor 4 is connected to the electronic control unit 5 through the cable. The cable extends from the liquid cooling area 13 to the electrical control area 14 through the opening 61. Because the opening 61 is located on the top of the partition 6, the coolant cannot flow from the liquid cooling area 13 to the electrical control area 14 through the opening 61.

As shown in FIG. 1, in some embodiments, the liquid cooling device 100 can be a CDU (Coolant Distribution Unit) or a RPU (Reservoir and Pump Unit).

As shown in FIG. 1, in some embodiments, the plurality of liquid delivery pieces 21 can include tanks, pipes, pumps, flow meters and so on. The electronic control unit 5 can be a PCBA (Printed Circuit Board Assembly).

The embodiments shown and described above are only examples. Even though numerous characteristics and advantages of the present technology have been set forth in the foregoing description, together with details of the structure and function of the present disclosure, the disclosure is illustrative only, and changes may be made in the detail, including in matters of shape, size, and arrangement of the parts within the principles of the present disclosure, up to and including the full extent established by the broad general meaning of the terms used in the claims.

What is claimed is:

1. A liquid cooling device comprising:

a cabinet configured for containing an electronic component;

a liquid flowing unit placed in the cabinet, the liquid flowing unit comprising a plurality of liquid delivery pieces connected in sequence and configured for circulating coolant to cool the electronic component;

a liquid tray placed in the cabinet and below the liquid flowing unit, the liquid tray defining a confluence groove configured for gathering the coolant leaking from two connected ones of the plurality of liquid delivery pieces; and a liquid sensor placed in the confluence groove, the liquid sensor being configured for sending a signal when the liquid sensor senses the coolant, wherein when the coolant leaks from two connected ones of the plurality of liquid delivery pieces and drops on the liquid tray and is gathered in the confluence groove by gravity, the liquid sensor senses the coolant in the confluence groove and sends the signal;

the liquid tray comprises a base plate and an edge board, the edge board is connected to an edge of the base plate and is located on an upper surface of the base plate, the liquid sensor is located on the upper surface of the base plate, the confluence groove is formed along the edge board;

the base plate comprises a plurality of bumps, the plurality of bumps protrude from the upper surface of the base plate, the liquid sensor is located on an area of the upper surface of the base plate without the plurality of bumps, the confluence groove is formed around a foot of each of the plurality of bumps, the plurality of bumps is configured for guiding the coolant to flow down to the confluence groove when the coolant drops on the plurality of bumps.

2. The liquid cooling device of claim 1, wherein each of the plurality of bumps defines a spherical surface or an ellipsoidal surface.

3. The liquid cooling device of claim 2, wherein a height of each of the plurality of bumps is equal to a height of the edge board.

4. The liquid cooling device of claim 1, wherein the cabinet defines an inner bottom surface and a positioning piece, the liquid tray is placed between the liquid flowing unit and the inner bottom surface, the positioning piece comprises a cylinder and a block, the cylinder is connected to the inner bottom surface, the block is located on an end of the cylinder away from the inner bottom surface, the base plate comprises a connecting part, the connecting part protrudes from the base plate towards the liquid flowing unit, the connecting part defines a strip hole, the strip hole defines a first section and a second section, the block and the cylinder are passable through the first section, the cylinder is passable through the second section, the block is not passable through the second section.

5. The liquid cooling device of claim 1, wherein the base plate comprises a plurality of hooks, the liquid sensor is a wire, the plurality of hooks are located on the upper surface of the base plate, the plurality of hooks are arranged along the wire and are configured for positioning the wire to the base plate.

6. The liquid cooling device of claim 1, wherein the cabinet defines a liquid cooling area and an electrical control area, the liquid cooling area and the electrical control area are arranged in a horizontal direction, the liquid flowing unit, the liquid tray, and the electronic component are placed in the liquid cooling area, the liquid cooling device further comprises an electronic control unit, the electronic control unit is placed in the electrical control area, the liquid flowing unit and the liquid sensor are connected to the electronic control unit.

7. The liquid cooling device of claim 6, wherein the liquid cooling device comprises a partition, the partition is placed in the cabinet, the partition separates the cabinet into the liquid cooling area and the electrical control area, the partition seals the liquid cooling area and the electrical control area.

8. The liquid cooling device of claim 7, wherein the partition defines an opening, the opening is located on the top of the partition, the opening is connected to the liquid cooling area and the electrical control area, the liquid cooling device further comprises a cable, the liquid flowing unit is connected to the electronic control unit through the cable, the liquid sensor is connected to the electronic control unit through the cable, the cable extends from the liquid cooling area to the electrical control area through the opening.

9. A server comprising:

an electronic component; and a liquid cooling device comprising:

a cabinet being configured for containing the electronic component;

a liquid flowing unit placed in the cabinet, the liquid flowing unit comprising a plurality of liquid delivery pieces, the plurality of liquid delivery pieces being connected in sequence and being configured for circulating coolant to cool the electronic component;

a liquid tray placed in the cabinet and below the liquid flowing unit, the liquid tray defining a confluence groove, the confluence groove being configured for gathering the coolant leaking from two connected ones of the plurality of liquid delivery pieces; and a liquid sensor placed in the confluence groove, the liquid sensor being configured for sending a signal when the liquid sensor senses the coolant, wherein when the coolant leaks from two connected ones of the plurality of liquid delivery pieces and drops on the liquid tray and is gathered in the confluence groove by gravity, the liquid sensor senses the coolant in the confluence groove and sends the signal;

the liquid tray comprises a base plate and an edge board, the edge board is connected to an edge of the base plate and is located on an upper surface of the base plate, the liquid sensor is located on the upper surface of the base plate, the confluence groove is formed along the edge board;

the base plate comprises a plurality of bumps, the plurality of bumps protrude from the upper surface of the base plate, the liquid sensor is located on an area of the upper surface of the base plate without the plurality of bumps, the confluence groove is formed around a foot of each of the plurality of bumps, the plurality of bumps is configured for guiding the coolant to flow down to the confluence groove when the coolant drops on the plurality of bumps.

10. The server of claim 9, wherein each of the plurality of bumps defines a spherical surface or an ellipsoidal surface.

11. The server of claim 10, wherein a height of each of the plurality of bumps is equal to a height of the edge board.

12. The server of claim 9, wherein the cabinet defines an inner bottom surface and a positioning piece, the liquid tray is placed between the liquid flowing unit and the inner bottom surface, the positioning piece comprises a cylinder and a block, the cylinder is connected to the inner bottom surface, the block is located on an end of the cylinder away from the inner bottom surface, the base plate comprises a connecting part, the connecting part protrudes from the base plate towards the liquid flowing unit, the connecting part defines a strip hole, the strip hole defines a first section and a second section, the block and the cylinder are passable through the first section, the cylinder is passable through the second section, the block is not passable through the second section.

13. The server of claim 9, wherein the base plate comprises a plurality of hooks, the liquid sensor is a wire, the plurality of hooks are located on the upper surface of the base plate, the plurality of hooks are arranged along the wire and are configured for positioning the wire to the base plate.

14. The server of claim 9, wherein the cabinet defines a liquid cooling area and an electrical control area, the liquid cooling area and the electrical control area are arranged in a horizontal direction, the liquid flowing unit, the liquid tray, and the electronic component are placed in the liquid cooling area, the liquid cooling device further comprises an electronic control unit, the electronic control unit is placed in the electrical control area, the liquid flowing unit and the liquid sensor are connected to the electronic control unit.

15. The server of claim 14, wherein the liquid cooling device comprises a partition, the partition is placed in the cabinet, the partition separates the cabinet into the liquid cooling area and the electrical control area, the partition seals the liquid cooling area and the electrical control area, the partition defines an opening, the opening is located on the top of the partition, the opening is connected to the liquid cooling area and the electrical control area, the liquid cooling device further comprises a cable, the liquid flowing unit is connected to the electronic control unit through the cable, the liquid sensor is connected to the electronic control unit through the cable, the cable extends from the liquid cooling area to the electrical control area through the opening.

16. A liquid cooling device comprising:

a cabinet being configured for containing an electronic component;

a liquid flowing unit placed in the cabinet, the liquid flowing unit comprising a plurality of liquid delivery pieces, the plurality of liquid delivery pieces being connected in sequence and being configured for circulating coolant to cool the electronic component;

a liquid tray placed in the cabinet and below the liquid flowing unit, the liquid tray comprising a plurality of bumps protruding from an upper surface of the base plate, the liquid tray defining a confluence groove around a foot of each of the plurality of bumps, the confluence groove being configured for gathering the coolant leaking from two connected ones of the plurality of liquid delivery pieces; and a liquid sensor placed in the confluence groove, the liquid sensor being configured for sending a signal when contacting with the coolant, wherein when the coolant leaks from two connected ones of the plurality of liquid delivery pieces and drops on one of the plurality of bumps and is gathered in the confluence groove by gravity, the liquid sensor senses the coolant in the confluence groove and sends the signal.

* * * * *